United States Patent [19]

Ledder et al.

[11] 4,247,333
[45] Jan. 27, 1981

[54] ALUMINA SHELL MOLDS USED FOR INVESTMENT CASTING IN DIRECTIONAL SOLIDIFICATION OF EUTECTIC SUPERALLOYS

[75] Inventors: Glenn W. Ledder, Buffalo; Wayne D. Pasco, Ballston Spa; Paul S. Svec, Scotia, all of N.Y.

[73] Assignee: General Electric Company, Schenectady, N.Y.

[21] Appl. No.: 106,876

[22] Filed: Dec. 26, 1979

[51] Int. Cl.³ .............................................. B28B 7/34
[52] U.S. Cl. .................................... 106/38.9; 106/65; 264/65
[58] Field of Search .................... 106/38.9, 65; 264/65

[56] References Cited

U.S. PATENT DOCUMENTS 4,131,475  12/1978  Svec ..................................... 106/38.9
4,187,266  2/1980  Greskovich et al. ............... 106/38.9

Primary Examiner—Lorenzo B. Hayes
Attorney, Agent, or Firm—Jane M. Binkowski; James C. Davis, Jr.; Leo I. MaLossi

[57] ABSTRACT

An alumina investment casting mold has a microstructure characterized by the porous nature of the interconnecting alumina grains which is indicative of alumina-silica molds fired in a reducing atmosphere to remove the silica.

1 Claim, 4 Drawing Figures

ALUMINA SHELL MOLDS USED FOR INVESTMENT CASTING IN DIRECTIONAL SOLIDIFICATION OF EUTECTIC SUPERALLOYS

BACKGROUND OF THE INVENTION

1. Field of the Invention

This invention relates to investment casting molds and in particular to an alumina mold made from a silica-bonded alumina investment casting mold.

2. Description of the Prior Art

Investment casting of superalloy materials and directionally solidified eutectic materials for making aircraft engine turbine blades is currently practiced in silica-bonded alumina molds. The presence of the silica in the mold limits the casting temperature and, therefore, the alloys which can be successfully cast. In addition, silica can react with the superalloy metal cast in contact therewith thereby causing surface defects. Precision casting is limited because of the defective surfaces and/or oversize parts must be cast and then machined to size in order to remove the surface defects.

An all alumina mold would enable one to cast at higher temperatures and to substantially reduce defects in the casting, particularly in the surface areas.

Therefore, it is an object of this invention to provide a new and improved alumina mold for the investment casting of superalloy materials and directionally solidified materials which overcomes the deficiencies of the prior art.

Another object of this invention is to provide a new and improved alumina mold wherein the microstructure is indicative of alumina molds made from silica-bonded alumina molds.

Other objects of this invention will, in part, be obvious and will, in part, appear hereinafter.

BRIEF DESCRIPTION OF THE INVENTION

A silica-bonded shell mold is made from primary and secondary coating slurries comprising alumina flour and silica bonding material. The alumina flour may be of an individual mesh size or a mixture of two or more alumina flours of different mesh sizes. Preferably, the alumina flours consist of tabular alumina and/or fused alumina material, including the sand coats.

The silica-bonded alumina mold is fired in a controlled atmosphere which is reducing to silica to produce a mold consisting essentially of alumina. The fired shell mold has a microstructure characterized by the porous nature of the interconnecting alumina grains.

DESCRIPTION OF THE INVENTION

Figure 1:
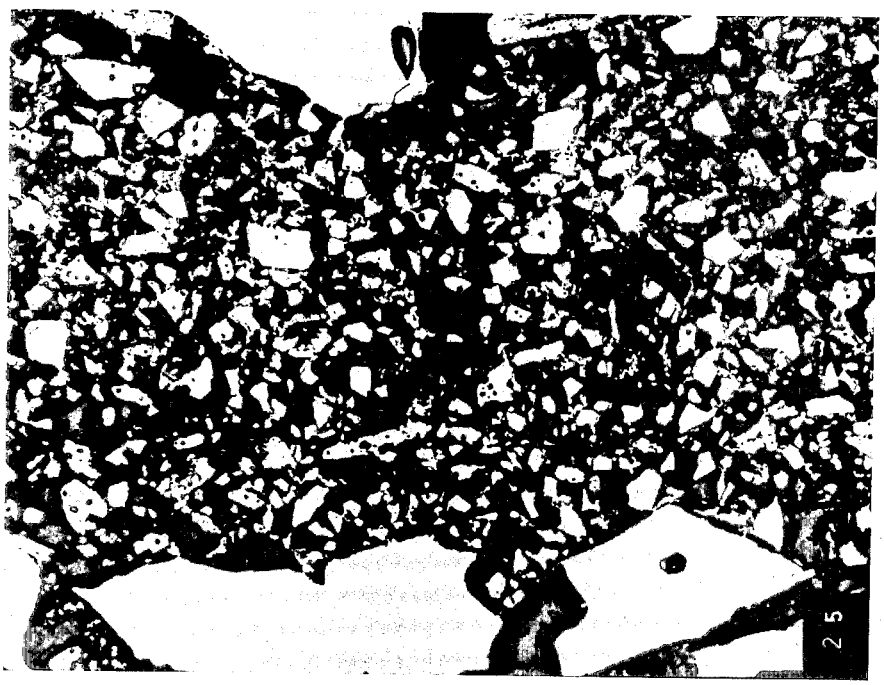
FIG. 1 is a photomicrograph, at 300X of the microstructure of a silica-bonded alumina shell mold fired in dry hydrogen at 1700° C. for 4 hours.

With reference to FIG. 1, there is shown a photomicrograph of the microstructure of the material of an alumina investment casting mold made from a silica-bonded alumina mold. The microstructure exhibits the porous nature of the interconnecting alumina grains indicative of the mold being made by firing silica-bonded alumina molds in a reducing atmosphere.

The alumina mold is made by firing a silica-bonded alumina mold in a controlled atmosphere which is reducing to the silica. Preferably, the atmosphere has its dewpoint controlled as well. Dry hydrogen, that is, hydrogen having a dewpoint no greater than about −35° F. has been discovered to be a suitable atmosphere to reduce silica and eliminate the silica from the mold.

The silica-bonded mold comprises one or more primary costs of material and one or more secondary coats of material. A mixture of two or more flour sizes of fused alumina provide an excellent material composite for the one or more primary costs required to form a suitable inner mold wall for the casting of metal therein, particularly for superalloy metals, and the directional solidification thereof. Fused alumina flour sizes are closely controlled by the manufacturer, since they are basically produced for other uses. Therefore, a mixture of two or more fused alumina flours is preferred to acquire a grain size distribution to decrease voids at the metal-mold interface and to produce a slurry in which settling of the refractory flour is nil. Fused alumina is chosen because of its inherently low densification characteristics, high temperature capability, and resistance to attack by the material being cast.

Preferably, the flour is a high-purity alumina greater than 98% by weight $Al_2O_3$. The flour, when the mold is employed for the casting and directional solidification of turbine components having a high standard of surface finish requirements, is acid-washed to remove impurities, such as iron, which is detrimental to the formulation of a suitable primary slurry. Grain sizes must be considered since surface finish of molds and mold permeability is important when an acceptable casting is desired. A flour mixture containing a high percentage of large grains will produce a rough inner mold wall. This roughness is reproduced on the casting surface. A flour containing a large percentage of "fines" requires an excessive amount of binder and usually causes mold wall "buckling".

The colloidal silica binder is available as a commercial product Nalcoag and contains 36% silica by weight. Nalcoag is a trademark of colloidal silica binder sold by the Nalco Chemical Company. This colloidal solution is diluted with de-ionized water to vary the silica content from 36% by weight to 15% by weight. The binder is diluted to 18% by weight, preferably by using deionized water, and employed in the primary slurry. Total percentage of diluted binder may vary from 27% by weight to 35% by weight of the total slurry, depending on the flour mixture employed.

Other slurry additions are required. A wetting agent to ensure proper wetting of the wax pattern by the slurry. A non-ionic wetting agent is preferred since these are compatible with the binder (colloidal silica) employed. These agents are readily available commercially. 8 cc to 12 cc of wetting agent per 100 lbs. total weight of the slurry will induce good wetting properties to the slurry. Also, a defoaming agent may be required if excessive foam is noted on the slurry during the mixing operation. If good slurry mixing practices are followed, foaming will not be a serious problem.

Antifoam 60, manufactured by the General Electric Company, in the amount of 0.005% by weight to 0.008% by weight of the slurry may be added directly to the slurry.

The primary flour mixture is prepared by blending the two or more alumina flours together for a period of time to assure one of achieving a good mixture of the flour sizes. Each of the flour mixtures are preferably blended for a period of at least one hour. The colloidal silica solution is prepared and poured into the mixing vessel, usually of stainless steel material construction. About 90% by weight of the blended flour mixture is then added to the colloidal silica solution. The flour and colloidal silica solutions are then mixed until the viscosity of the resulting slurry becomes stabilized.

The remaining blended flour mixture is then added to the mixture and the mixing, or stirring action, is continued for a period of time to ensure a good mixture. One may allow mixing to continue overnight as a means of convenience, or for a period of up to about 10 hours therefor.

The specific gravity of the mixture is checked and adjusted to fall within a range of 2.20 and 2.45. If the specific gravity is too low, below 2.20, small amounts of alumina flour comprising of the flour mixture to increase the specific gravity of the mixture. Should the specific gravity be greater than 2.45 one may add small amounts of the colloidal silica solution to achieve the desired range of specific gravity.

The viscosity of the primary slurry is adjusted to fall within a range of from 5 to 20 seconds with a #5 Zahn cup. Preferably, a range of from 7 to 10 seconds as measured with the #5 Zahn cup is desired. Adjustments are made in the same manner as that employed in adjusting to the specific gravity range.

The following flour mixtures have been employed and yield satisfactory primary slurries. All percentages are by weight percent and all flours are fused alumina, U.S. Standard sieve size, acid washed. The mesh designations are also employed by the Norton Company and are understood by those skilled in the art to designate a flour material that is almost entirely of a particular size. Further, it is also understood by those skilled in the art that the alumina particles have passed through the openings of a screen size for the specific purpose of sizing the material.

| Mix #1 | Mix #6 |
|---|---|
| 240 mesh 50% | 240 mesh 65% |
| 400 mesh 50% | 320 mesh 35% |
| Mix #2 | Mix #7 |
| 240 mesh 66% | 240 mesh 85% |
| 320 mesh 34% | 400 mesh 15% |
| Mix #3 | Mix #8 |
| 240 mesh 50% | 240 mesh 70% |
| 320 mesh 50% | 320 mesh 25% |
|  | 400 mesh 5% |
| Mix #4 | Mix #9 |
| 240 mesh 90% | 240 mesh 85% |
| 320 mesh 10% | 320 mesh 15% |
| Mix #5 | Mix #10 |
| 320 mesh 90% | 240 mesh 10% |
| 400 mesh 10% | 320 mesh 90% |

Secondary slurry mixtures are prepared in the same manner. #Tabular alumina flour of −325 mesh U.S. Screen Sieves may also be employed in the flour mixtures. Since the material of the secondary slurry material is employed to add strength to the mold, the slurry may comprise alumina of a single size or a mixture of two or more alumina flour sizes. The flour sizes may be of the same range as that of the primary slurry or of slightly larger sizes. Preferably, the same flour mixture of the primary slurry may be used for the makeup of the secondary slurry. The binder is commerically available colloidal silica, of which 36 percent by weight is silica. Alternately, some of the primary slurry is utilized as a secondary slurry by adjusting the specific gravity and viscosity to the desired range for the secondary slurry. The adjustment is the same as that practiced for preparing the primary slurry. The specific gravity is adjusted to fall in a range from 1.9 to 2.2. The viscosity is adjusted to fall within a range of from 5 to 15 seconds as measured with a #5 Zahn cup. A range of from 6 to 7 seconds as measured by a #5 Zahn cup is desirable.

Grain or sand coats are employed between each slurry coating layer, to held bind mutually adjacent slurry layers together. No binder material is employed. Each grain or sand coat consists of fused alumina material and the ranges are from 70 to 100 mesh size for primary slurry coatings and from 36 to 54 mesh for secondary slurry coatings. The grain or sand coats are applied to each drained coated waxed pattern, as required, by immersing the same in a fluidized bed of the fused alumina material. The fused alumina material is also available from the Norton Company.

In preparing an investment mold each pattern is preferably coated with at least two coats of primary slurry material. However, when desired, more than two primary slurry coats may be applied to the pattern. A sand, or grain coat of the applicable grain size is applied between each slurry coating.

Excess slurry material is allowed to drain from pattern before applying a sand or grain coating. The pattern now coated with the primary slurry and sand is allowed to air dry for at least 1.5 hours before applying another coat. Longer times may be necessary when undesirable drying conditions exist, i.e. high humidity.

Two primary coats, each consisting of a primary slurry application and a primary sand or grain application are preferred. Then a plurality of secondary coatings are applied after the primary coatings are dried enough to accept them.

At least four secondary coatings are applied to achieve the desired mold strength. After each secondary slurry application a sand or grain coat is applied, each application of slurry and sand or grain is allowed to air dry at least 1 hour.

A "seal coat" consisting of the secondary slurry mixture is applied over the final sand or grain coat. The purpose of the "seal coat" is to keep the last sand or grain coat in place.

The completed shell investment mold for the desired application of casting and directional solidification of super-alloys therein is dried at room temperature. Preferably, air drying at room temperature is continued for at least 12 hours. Therefore, one may accomplish this end by air drying the mold overnight before dewaxing.

The air dried shell molds are dewaxed by any standard technique known to those skilled in the art. I have used the "flash dewax" technique. In this technique, the air dried molds are placed directly into a furnace, that has been preheated to 1000° C.±25° C.

As the wax melts it vacates the mold. The mold is left in this oxidizing environment, at 1000° C. in air, for 1.5 to 2 hours. The heat source is then turned off and the molds are allowed to furnace cool. The material composition of the shell is now $Al_2O_3+SiO_2$.

The silica-bonded alumina molds are then fired in a controlled atmosphere which is reducing to silica. The process of the hydrogen reduction of the silica or any other gaseous reduction of silica of the mold requires temperatures in excess of 1500° C. in the presence of low $P_{H_2O}$ hydrogen gas. A dry hydrogen atmosphere and a temperature of 1700° C. and greater has been found sufficient to reduce all of the silica in mold in a firing time of 3 hours or more for the size of the molds fired. By "dry" hydrogen is meant hydrogen gas having a dewpoint of less than −35° F. The silica in the mold is reduced by the hydrogen forming silicon monoxide gas flowing through the furnace in which the mold is fired.

Other suitable gases for the controlled atmosphere are carbon monoxide, and a mixture of carbon monoxide and an inert gas such as argon and a mixture of hydrogen and and an inert gas. However, the partial pressure of oxygen in these gases should not be greater than about $10^{-15}$ atmospheres.

The following example illustrates the teachings of the invention:

A primary coating slurry was prepared in the manner described heretofore in the specification. The alumina flour was tabular in shape and −325 Mesh, U.S. Screen Series. The binder was Nalco 1035 diluted to 15 percent by weight silica. The composition by weight percent upon drying was about 95 percent alumina, 5 percent silica.

In the same manner as described heretofore, a secondary coating slurry was prepared wherein the alumina was a 50—50 mixture by weight percent of −325 Mesh tabular alumina and 240 mesh fused alumina. The mesh size is in U.S. Screen Series. The silica binder was Nalco 1035 comprising 36 weight percent silica. Upon drying the composition by weight percent was about 85 percent alumina and 15 percent silica.

Several molds were fabricated employing a wax pattern of a turbine blade. To make each mold, two primary coatings were applied first and 70 mesh fused alumina used as sand coat material. The mesh is U.S. Screen Series.

The fabricated molds were dewaxed after in drying for at least 12 hours at room temperature. Dewaxing of the molds was practiced at 1000° C.±25° C. for a minimum of 2 hours.

Figure 2:
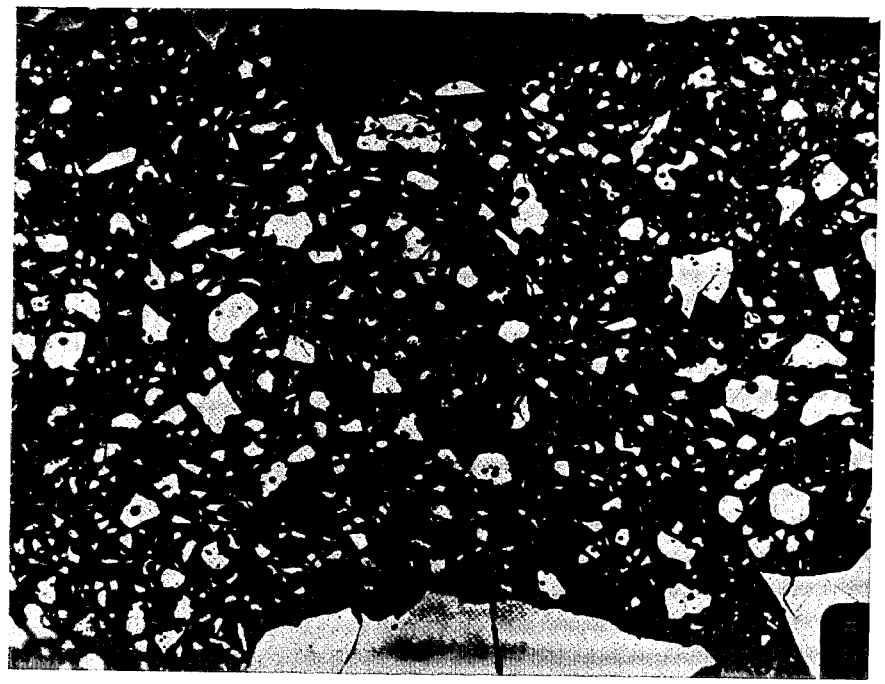
FIG. 2 is a photomicrograph, at 300X, of the microstructure of a silica-bonded alumina shell mold fired in air at 1000° C.

One of the fired molds was sectioned to study the microstructure of the mold. FIG. 2 illustrates the microstructure of the facecoat region of the silica bonded shell mold.

At this point, all of the chemisorbed water has been driven off and some amount of sintering of the silica has occurred. At 1000° C. no reaction between silica and alumina has occurred to form either a metastable liquid phase or a stable mullite phase.

Figure 3:
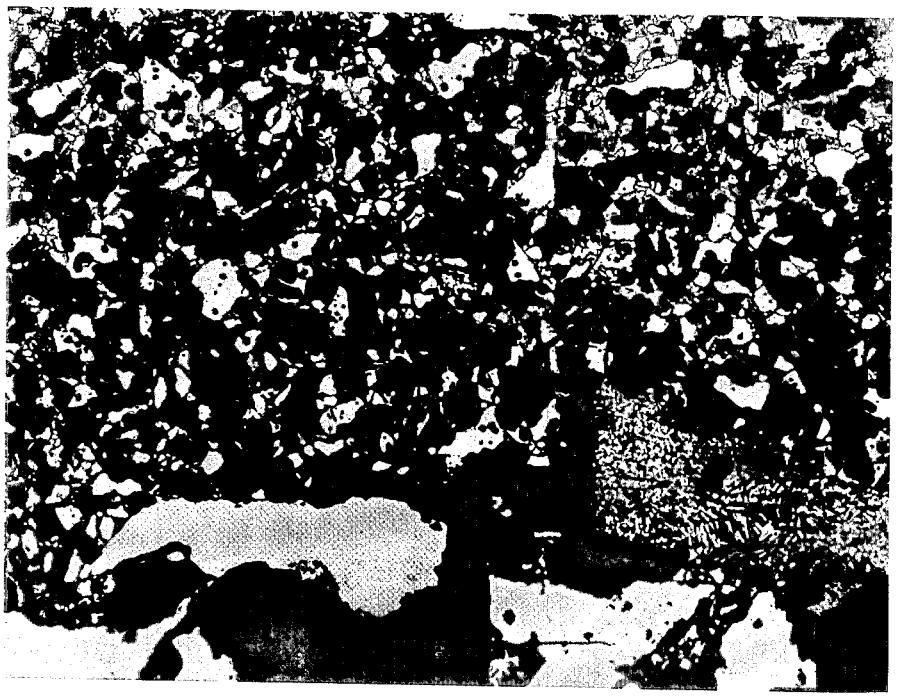
FIG. 3 is a photomicrograph, at 300X, of the microstructure of a silica-bonded alumina shell mold fired in air at 1500° C. for two hours.

The dewaxed molds were then heated in air to 1500° C.±10° C. and is thermally held at that temperature for 2 hours. One mold was again sectioned and its microstructure studies. FIG. 3 illustrates the microstructure of the facecoat region wherein mullite 10, the grey phase, exists between adjacent alumina particles 12.

A comparison of the two Figures indicates that adjacent alumina grains 12 are in closer proximity to each other in FIG. 3 than in FIG. 2.

The remaining molds were heated to 1500° C.±10° C. in a controlled atmosphere of hydrogen having a dewpoint of < −40° F. and isothermally heated at temperature for 4 hours.

The molds were sectioned to investigate the microstructure of the material of the fired molds. FIG. 1 is illustrative of the microstructure of the facecoat of one of the fired molds. A comparison of the microstructure of FIG. 1 with the microstructure of FIG. 3 indicates that all traces of the mullite, the grey phase in FIG. 3, has disappeared. An increased degree of connectivity between adjacent alumina grains is noted when compared to the microstructures illustrated in FIGS. 2 and 3.

The interconnecting alumina grains 12 in FIG. 1 are indicative of the breakdown of mullite into alumina rather than increased connectivity due to solid state sintering associated with the increased firing temperature of 1700° C. This porous interconnectivity between the alumina grains is an unique identifying feature of silica bonded alumina molds fired in hydrogen gas of a dewpoint of −35° F. at 1700° C. and higher.

Figure 4:
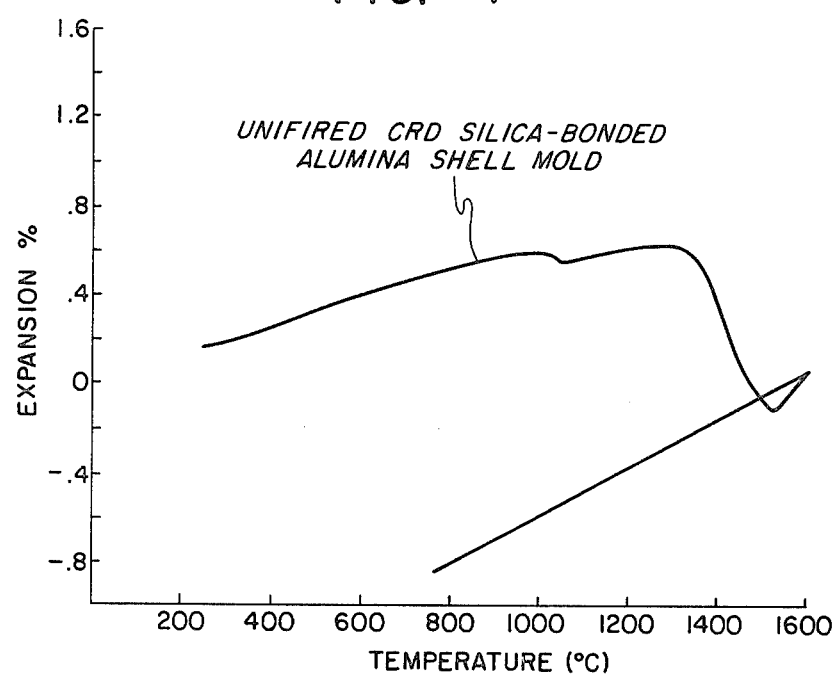
FIG. 4 is a dialatometric trace of a silica-bonded alumina shell mold upon heating from room temperature to 1600° C.

The change in volume of molds was studies during the firing of the molds, FIG. 4 is a dilametric trace of one of the shell molds studied upon heating the mold from room temperature to 1600° C. and furnace cooling to below 800° C. in air. When the mold is heated to a temperature above 1300° C. in air, a substantial densification of the material of the mold occurs and the overall, the mold shrinks. The shrinkage of the mold material is attributable to the formation of a metastable liquid phase and concommitant liquid phase sintering. Further, heating at increasing elevated temperatures results in the crystallization of the metastable liquid to a stable mullite phase. This type of mullite phase is illustrated in FIG. 3.

A section of a hydrogen fired mold was examined by X-ray diffraction analysis. No crystalline phases were present except for α-alumina. Electron microprobes of the interior surface of the mole(facecoat of mold), to be contacted by the cast metal. The middle portion of the mold and the outside region of the mold indicated that silicon or silica was not present in any of the probed areas. Metallographic analysis of another section of the fired mold disclosed only α-alumina and no other phases. Debye-Scherrer analysis was performed on samples of vapor-grown crystals from the cooler part of the furnace. They proved to be α-cristobalite. The presence of the vapor grown crystals found in the furnace indicates the flow of hydrogen was sufficient to reduce the silica out of the molds and carry the vapors to the cold zone of the furnace.

A further study of the effect of firing silica-bonded molds in dry hydrogen was to compare the microstructure of a mold fired in dry hydrogen and a mold which had only been dewaxed. Determination of the presence of silicon was made by employment of an electron microprobe. A comparison study was made of sections from the facecoat area, the middle regions and the outer regions of the molds. A silicon map photo and a corresponding backscattered-electron photo was taken of a portion of each region and facecoat area and a comparison made therebetween.

In the untreated mold, measurable amounts of silicon were found in the slurry regions of the mold. These slurry regions were the areas between coarse grains of alumina. However, in the mold fired in dry hydrogen (−35° F.) at 1750° C. for three hours, no silicon could be detected anywhere in the microstructure of the mold.

From this investigation, it has been concluded that firing silica-bonded molds in dry hydrogen, as described in this specification, removes the silica from the mold and produces an all alumina mold.

A series of molds were prepared like the examples above to cast a melt therein of NiTaC-13, a directionally solidified eutectic alloy developed by the General Electric Company. The cast metal was directionally solidified in the mold. NiTaC-13 is a superalloy material having a high nickel content and, as cast, had the following nominal chemical composition:

| | |
|---|---|
| Nickel | 63.4% |
| Chromium | 4.4% |
| Cobalt | 3.3% |
| Aluminum | 5.4% |
| Tungsten | 3.1% |
| Rhenium | 6.2% |
| Vanadium | 5.6% |

*-continued*

| | |
|---|---|
| Tantalum | 8.1% |
| Carbon | 0.4% |

The casting temperature was 1650° C.±50° C. Directional solidification of the cast metal was practiced for 24 hours.

All of the molds showed excellent service life. All the castings were of commercial quality and required little final finishing of the surfaces. No detrimental metal-mold interface reaction was noted.

We claim as our invention:

1. An alumina shell mold formed in situ by firing a silica-bonded alumina shell mold in a controlled atmosphere of dry hydrogen gas having a dewpoint of less than 35° F. at a temperature of at least 1700° C, wherein said mold has a microstructure characterized by the porous nature of the interconnecting alumina grains.

* * * * *